United States Patent [19]

Patel

[11] 4,205,324

[45] May 27, 1980

[54] METHODS AND MEANS FOR SIMULTANEOUSLY CORRECTING SEVERAL CHANNELS IN ERROR IN A PARALLEL MULTI CHANNEL DATA SYSTEM USING CONTINUOUSLY MODIFIABLE SYNDROMES AND SELECTIVE GENERATION OF INTERNAL CHANNEL POINTERS

[75] Inventor: Arvind M. Patel, San Jose, Calif.

[73] Assignee: International Business Machines Corporation, Armonk, N.Y.

[21] Appl. No.: 884,463

[22] Filed: Mar. 7, 1978

Related U.S. Application Data

[63] Continuation-in-part of Ser. No. 863,653, Dec. 23, 1977.

[51] Int. Cl.² ............................................. G06F 11/12
[52] U.S. Cl. .......................................................... 371/50
[58] Field of Search ............................... 340/146.1 AL

[56] References Cited

U.S. PATENT DOCUMENTS

| | | | |
|---|---|---|---|
| Re. 28,923 | 8/1976 | Patel | 340/146.1 AL |
| 3,745,526 | 7/1973 | Hong et al. | 340/146.1 AL |
| 3,745,528 | 7/1973 | Patel | 340/146.1 AL |
| 3,800,281 | 3/1974 | Devore et al. | 340/146.1 AL |
| 3,851,306 | 11/1974 | Patel | 340/146.1 AL |
| 3,868,632 | 2/1975 | Hong et al. | 340/146.1 AL |
| 3,958,220 | 5/1976 | Marshall | 340/146.1 AL |
| 4,052,698 | 10/1977 | Ragle | 340/146.1 AL |

Primary Examiner—Charles E. Atkinson
Attorney, Agent, or Firm—R. Bruce Brodie

[57] ABSTRACT

An apparatus for simultaneously correcting several channels in error is combined with a parallel multi channel data handling system. The apparatus encodes and records vertical parity checks in a first channel and encodes and records parity checks in a second and third channel or equivalent taken over the channels in respective predetermined positively and negatively sloped directions.

Upon readback, syndromes from the parity checks and the recorded data are obtained. Correction signals from at least two syndromes intersecting the same error in a known channel in error are formed. The values of the syndromes diagonally intersecting each error in the known channel are continuously modified as the error is detected by inversion of the simple parity. Correction is attained by logically combining the correction signals with the original known channel in error data.

Internal pointers to either first or subsequent channels in error are generated as a function of the bit position displacement in the in-channel direction between the occurrence of first and subsequent mismatches of vertical and diagonal syndromes. Internal pointers are generated either in the absence of or to supplement any external pointers.

11 Claims, 11 Drawing Figures

DATA FORMAT

TWO ERRORS IN $m^{th}$ BYTE

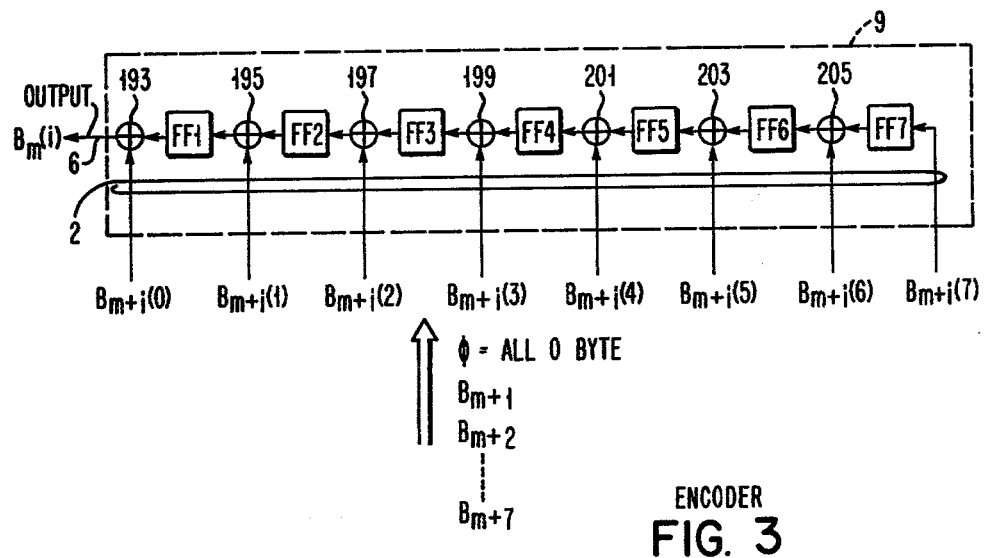
FIG. 3 ENCODER
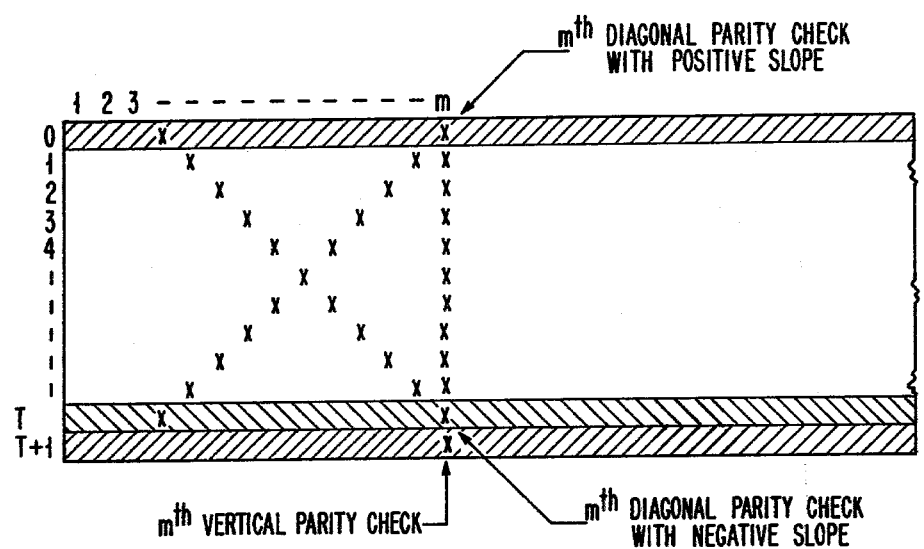
FIG. 2D

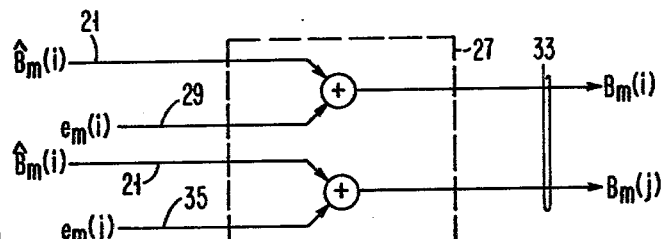
FIG. 5
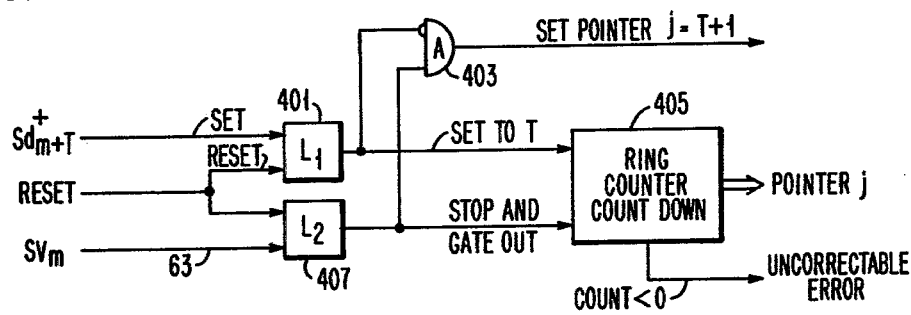
FIG. 6A  FIRST ERROR POINTER GENERATOR
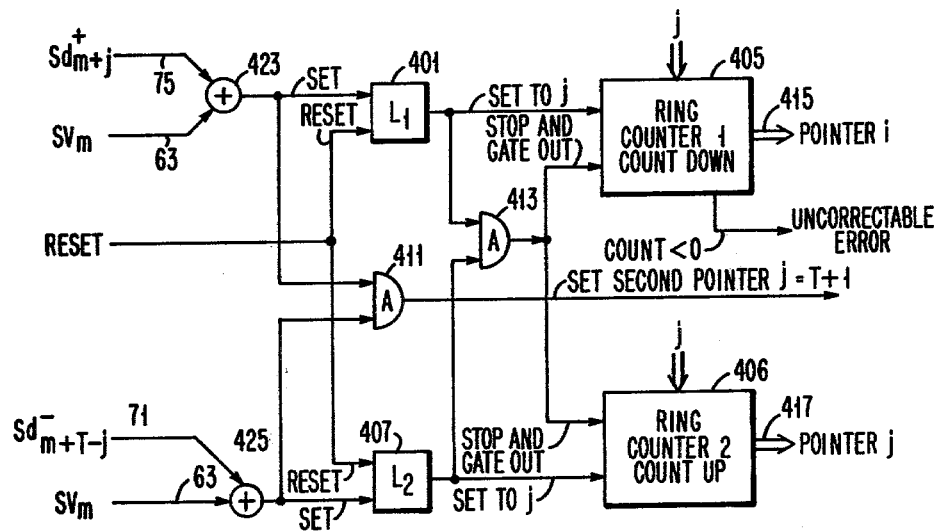
FIG. 6B  SECOND ERROR POINTER GENERATOR – FIRST POINTER ≠ TRACK 8
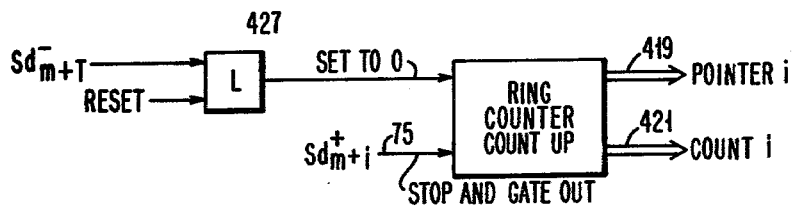
FIG. 6C  SECOND ERROR POINTER GENERATOR – FIRST POINTER = TRACK 8

METHODS AND MEANS FOR SIMULTANEOUSLY CORRECTING SEVERAL CHANNELS IN ERROR IN A PARALLEL MULTI CHANNEL DATA SYSTEM USING CONTINUOUSLY MODIFIABLE SYNDROMES AND SELECTIVE GENERATION OF INTERNAL CHANNEL POINTERS

OTHER APPLICATION CROSS REFERENCE

This application is a continuation-in-part of co-pending application U.S. Ser. No. 863,653, filed Dec. 23, 1977, entitled "Plural Channel Error Correcting Method and Means Using Adaptive Reallocation of Redundant Channels Among Groups of Channels," filed in the name of Arvind M. Patel.

BACKGROUND OF THE INVENTION

This invention relates to the detection and correction of known channels in error in a parallel multi-channel data handling system, such as a magnetic tape storage system. More particularly, the invention relates to increasing the number of correctable channels in error recorded on the same medium without increasing the number of redundant channels.

In magnetic tape storage systems, industry standards have governed tape size, data format, and recording density. Accordingly, $\frac{1}{2}''$ width tape has been used for recording nine tracks thereon. By custom, data are recorded parallel by bit and serially by byte across the tape. This format advantageously permits the use of the same nine track head for both the reading or writing of data on tapes at different densities.

Magnetic tape is soft and pliable. Unlike other forms of moving magnetic storage media, such as rigid magnetic disks, magnetic tape storage systems require the tape to move in non-uniform contact relation with one or more fixed heads as data are being transferred to or from the tape. Any loose particles of debris between head and tape or spots on tape with missing oxide causes loss of signal amplitude and resultant errors in data in one or more channels. Under the circumstances, it is possible for the read-back clock in the erroneous channel to loose synchronization with the data in other channels. Consequently, the recording and playback of data from the tape may be in error over very long segments. In this regard, the noisy length of tape poses a data recovery problem unlike that of either single shot noise or burst noise. Characteristically, single shot and burst noise induced errors are usually of finite duration. The reconstitution of the infected data is obtained by the use of error checking codes with cyclic properties. These codes are complex both in their theory and use.

Illustrative of a magnetic tape storage device capable of variable density recording and of utilizing a cyclic code for error detection and correction purposes is the IBM 3803 controller used with the IBM 3420 models 4, 6, and 8 tape drives. The cyclic code actually employed is described in Hong et al U.S. Pat. No. 3,868,632.

The present commercial practice is to reserve two out of nine channels for recording redundant information about the remaining seven channels of the set. This enables up to two channels in error to be subsequently corrected. In the case of recording two or more logically independent sets of parallel channels on a tape in which two redundant channels per set are reserved, reference should be made to co-pending U.S. Patent application Ser. No. 863,653, filed on Dec. 23, 1977 in the name of Arvind M. Patel. This co-pending application discloses a method and means of taking advantage of the unused redundancy of one set in order to assist in correcting multiple channels in error in another set.

The prior art of error detection and correction on a single nine channel data handling system is typified by Patel U.S. Pat. No. Re. 28,923; Hong et al U.S. Pat. No. 3,868,632; Louis, IBM Technical Disclosure Bulletin, Vol. 14, p. 38–46, May 1972; and Prusinkiewicz et al, "A Double Track Error Correction Code for Magnetic Tape," IEEE Transactions on Computers, June 1976, at pages 642 through 645.

Both the Patel and Hong et al codes require partitioning the information into consecutive blocks and calculating checking bits for each individual block using a cyclical parity encoding scheme. These are subsequently recorded. Upon recovery of the data from the parallel channels the checking bits of each block must, in effect, be recalculated and compared. The arrangements for implementing such cyclic codes belie their complexity and expense. Significantly, the checking information obtained when one data block is recovered is merely thrown away when recovery is made of the next data block.

The Prusinkiewicz et al reference discloses a coding arrangement which uses a vertical parity check and a single diagonal parity check as stored on two redundant channels for the purpose of correcting two channels in error. Lastly, Louis describes a method of record recovery from a plurality of tapes by the calculation of a data value replacing unavailable data from a simple parity modulo 2 added to the remaining available data.

SUMMARY OF THE INVENTION

It is an object of this invention to devise a method and means for the detection and correction of channels in error on a parallel multi-channel data handling system without the need for cyclic correction or block encoding and where checking information obtained in recovering recorded data may be used in the detection and correction of error in respect of data subsequently recovered.

It is a related object to devise a method and means for detecting and correcting up to three known channels in error having long (near infinite) error runs in addition to short runs.

It is still another object of the invention to devise a method and means for generating internal pointers to channels in error either in the absence of or supplement to external pointers.

Lastly, it is an object of the invention that the simple parity encoding be recordable in a variety of data formats permitting the checking bytes to be selectively interspersed or non-interspersed among the data bytes.

The foregoing objects are satisfied by an embodiment of the invention in which a parallel multi-channel data handling system having at least one redundant channel is combined with an apparatus for correcting up to three channels in error. In the apparatus, vertical parity checks are encoded and recorded in a first redundant channel while diagonal parity checks taken in a predetermined positively and negatively sloped direction are encoded and recorded in a format selected from one of a group of formats. The group consists of a non-dispersed format, such as second and third redundant channels, dispersed format involving pairs of regularly spaced cross-channel byte positions, or mixed formats in which regularly spaced cross-channel bytes are used together with a redundant channel.

In the accurate reproduction of the data previously recorded in the parallel channels, the apparatus determines syndromes from the parity checks and the data. More particularly, the apparatus determines both diagonal and vertical syndromes from the parity checks and the data. The detection of error is on the basis that two syndromes intersect the same error in a known error channel. Correction is achieved by logically combining the error/correction signal with the original channel data. In this regard, of the two intersecting syndromes, one of which must be a diagonal syndrome. In the generation of correction signals provision is made for selecting as between two diagonal syndromes, the one closest to the known channel in error.

In this invention, the continuous modification of the syndromes is perfected by simply inverting the parity of those syndromes diagonally intersecting each error in the known channel as it is detected. Thus, the remaining diagonal syndromes are only affected by new errors not as yet corrected.

It is an aspect of this invention that the internal pointers to channels in error can be generated from the diagonal and vertical syndromes either in the absence of external pointers or as a supplement thereto. In this regard, internal pointer generation involves a dedicated counter and modifying the counter values as a function of the bit position difference between mismatches in the parity check values among the diagonal and vertical syndromes. In this regard, a parity check mismatch between the first diagonal syndrome intersecting an error and the intersecting vertical syndrome is determinitive of both the start of and the direction in which the counter value will be changed. The next mismatch between a diagonal and the intersecting vertical syndromes determines when the counter is stopped. As suggested, the pointer itself consists of the count difference of the in-channel bit position between the first and second syndrome mismatches. A mismatch between the far diagonal and vertical causes the counter to increment while a mismatch between between the near diagonal and vertical causes the counter to decrement. The only exception is the occurrence of error in the channel reserved for vertical parity in which case both diagonals match and the vertical syndrome mismatches.

BRIEF DESCRIPTION OF THE DRAWING

FIGS. 2a–d are the sundry recording formats for channel parity encoding and recording.

FIG. 3 depicts a diagonal parity encoder.

FIG. 5 is the error corrector of the decoder shown in FIG. 4.

FIG. 6a sets forth the logic of a first internal pointer generator while FIGS. 6b and 6c respectively, show a second pointer generator with the first pointer respectively set $\neq 8$ and $= 8$.

DESCRIPTION OF THE PREFERRED EMBODIMENT

Figure 1:
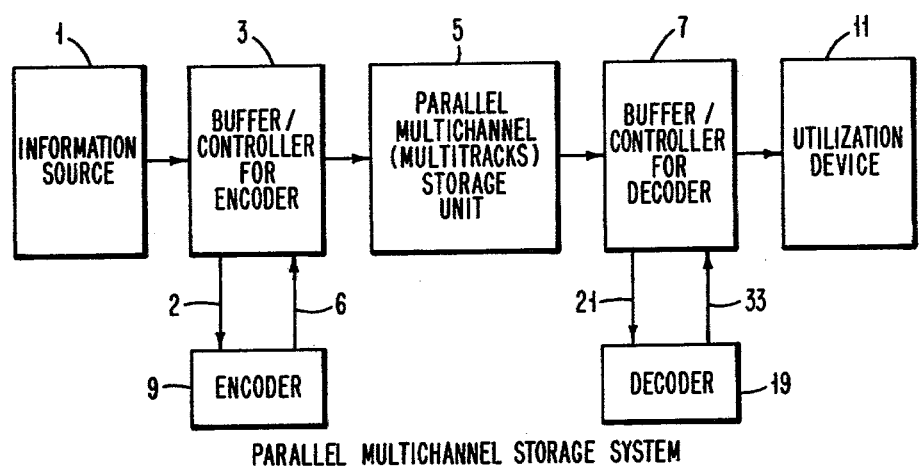
FIG. 1 is a block representation of a parallel multichannel storage system inclusive of the parity encoder for data writing and parity decoder for data error checking when data is read from the system according to the invention.

Referring now to FIG. 1, there is shown a general block diagram of a parallel multichannel data storage system incorporating the invention. Information from source 1 is applied to buffer/controller 3. The controller orchestrates the formatting of the data, securing the necessary parity encodings and causing said formatted and parity encoded data to be recorded on the parallel channels of storage unit 5. Correspondingly, buffer/controller 7, when activated, reads data previously recorded on said parallel channels, reformats and decodes said data for application to a utilization device 11.

Operationally, information in buffer 3 is fed in parallel form to a parity check encoder 9 over path 2 wherein parity check bits are sequentially generated for information signal sets referred to as bytes. After these parity check bits have been recorded, along with the information signals, and upon readback of both from the storage unit 5, then any parity detected errors in the information can be changed by deriving correction signals utilizing both syndromes and pointers and combining the correction signals with the readback information. The derivation of syndromes and correction signals occurs in decoder 19. The decoder derives the syndromes using the check bits, the check bits covering information (data) signals recorded in the so called vertical and in a positively or negatively sloped cross channel direction.

Figure 4:
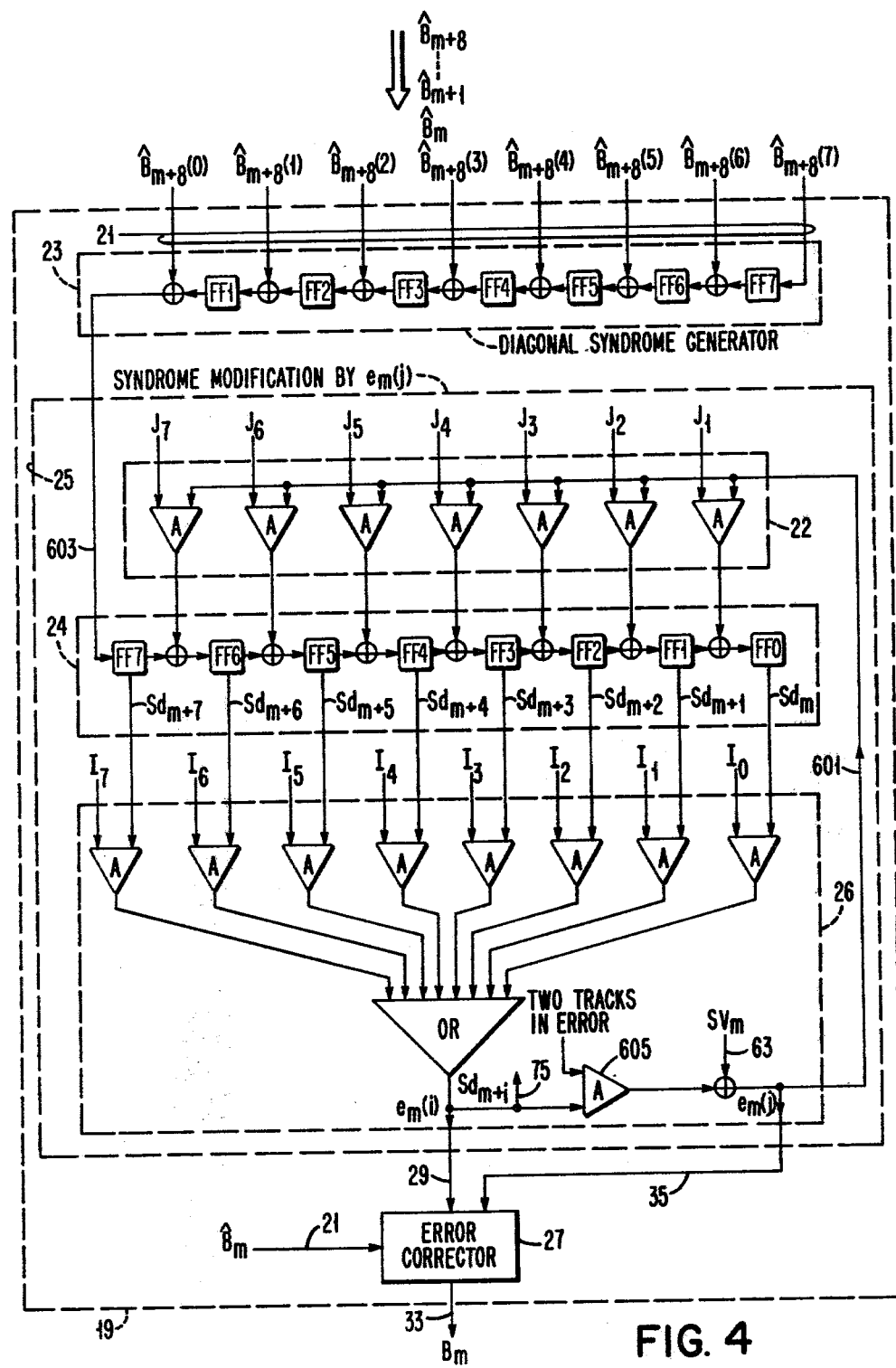
FIG. 4 shows the general logic for the decoder syndrome generation, modification, and correction signal production.

Referring again to FIG. 1, decoder 19 is shown interacting with buffer 7 in receiving data over path 21 and returning decoded data over path 33. In this regard, FIG. 4 is a logical diagram depicting decoder syndrome generation, modification, and correction signal production. Data applied over decoder input path 21 is in turn processed by elements 23, 24, and 27. Generally, data with error on the parallel tracks is applied on parallel lines of path 21 to the data distributor and syndrome generator 23. This, in turn, is applied to syndrome processing element 25. Correction signals $e_m(i)$ from element 25 for a single channel ($i=j$) on path 29 are applied to error corrector 27. For two channel correction, signals $e_m(i)$ and $e_m(j)$ are applied over paths 29 and 35. Continuous syndrome modification is achieved by feeding back the correction element to the syndrome modification element 22 on path 601 to interact with the new syndrome information being applied to the input of processing element 25 from the syndrome generator 23.

Recording Formats and Checking Bits For Two Channel Correction

Figure 2C:
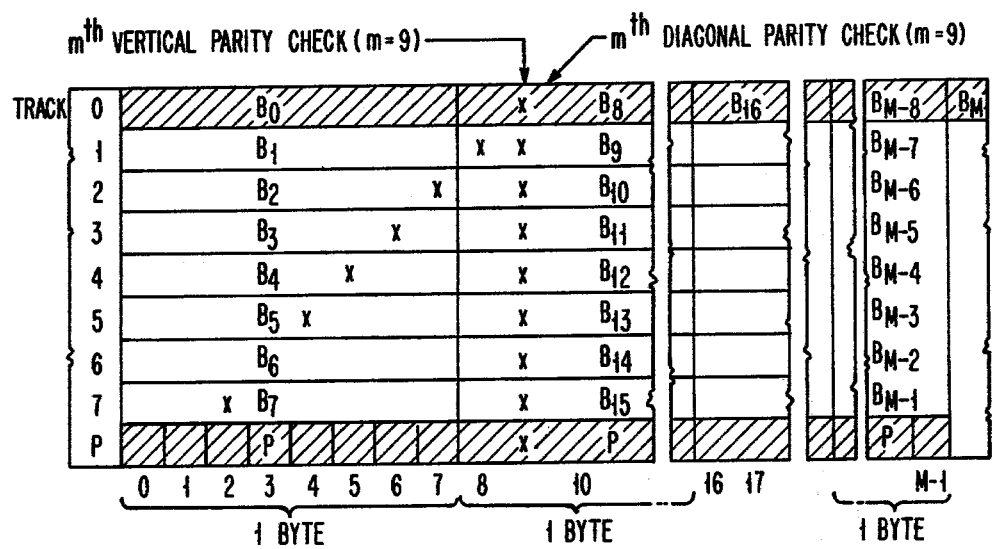
Figure 2A:
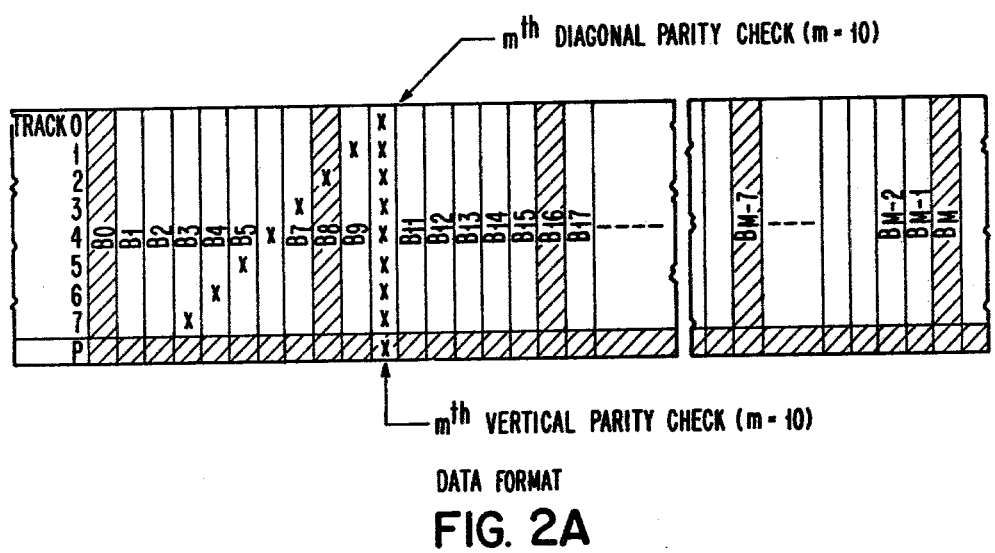
Figure 2B:
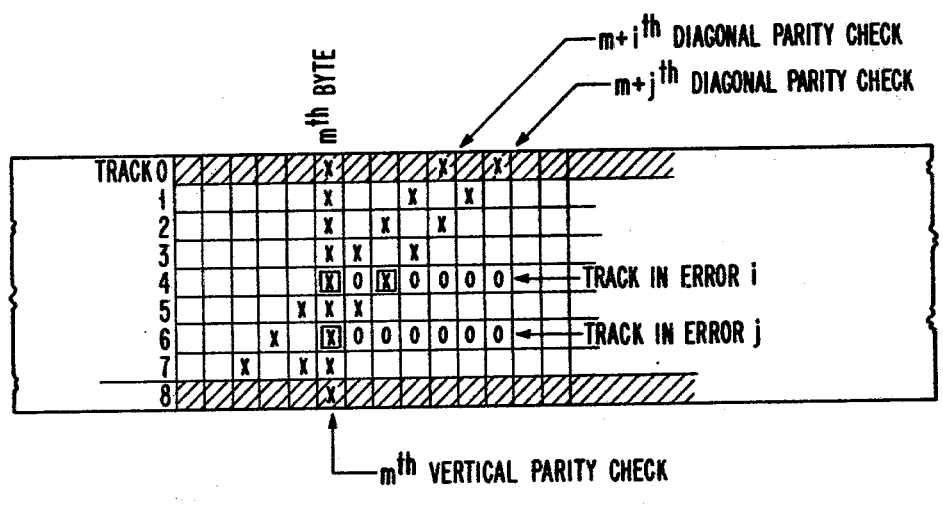

Referring now to FIGS. 2a through 2c, here are shown several formats for recording 9 parallel channels along a tape. As seen in FIG. 2a, channel 8 is reserved to record "parity" over the other 8 channels. Such a parity bit is known as the vertical redundancy check (VRC) bit as described in U.S. Pat. Nos. 3,508,194; 3,508,195; and 3,508,196. Each byte $B_m$ consisting of 8 bits and the VRC bit is simultaneously recorded in each of the 9 channels. It may be recovered from the recorded channels by readback and reassembly into bytes in accordance with Floros U.S. Pat. No. Re. 25,527.

Referring now to FIG. 2a, let $B_m(k)$ denote the $m^{th}$ bit along the $k^{th}$ channel progressing left to right. Furthermore, let $B_m$ represent an 8 bit byte recorded across a storage medium such as magnetic tape on parellel channels 0 to 7. It follows that $B_m$ can be expressed as $$B_m = [B_m(0), B_m(1), B_m(2), \ldots B_m(7)] \quad (1)$$

where m=0 to M and M=8×N.

$B_m(8)$ is the byte parity of $B_m$ recorded on channel P.

$$\text{i.e. } B_m(8) = \overset{7}{\underset{k=0}{\Sigma 0}} B_m(k) \quad (2)$$

(A circle over SUM sign indicates module-2 sum.)

$B_0$, $B_8$, $B_{16}$, $B_{24}$ . . . $B_{8N}$ are check bytes, each of which provide diagonal parity check involving 7 data bytes on both sides of it such that for any m $$B_m(k) = \overset{7-k}{\underset{t=1}{\Sigma 0}} B_{m-t}(k+t) \oplus \overset{k}{\underset{t=1}{\Sigma 0}} B_{m+t}(k-t) \quad (3)$$

At the two ends of the record, the bytes $B_{-1}$, $B_{-2}$, . . . $B_{-7}$ and the bytes $B_{8m+1}$, $B_{8m+2}$, . . . $B_{8m+7}$ are non-existent and are considered all-zero in computation of Equation (3). The parity checking Equation (2) and (3) can be rewritten as $$\overset{8}{\underset{k=0}{\Sigma 0}} B_m(k) = 0 \quad (4)$$

$$\overset{7}{\underset{k=0}{\Sigma 0}} B_{m-k}(k) = 0 \quad (5)$$

The read back bytes may be corrupted by errors. If the parity checks of Equations (4) and (5) are not satisfied, the result is called the syndrome of errors.

In the format of FIGS. 2b and 2c, channel 0 is also reserved for parity encoding. Indeed, channel 0 is reserved for recording the diagonal parity checks taken in the positively sloped direction. In FIG. 2d, diagonal parity checks are shown taken in both negatively and positively sloped directions. In this regard, the formats of FIGS. 2b and 2c are directed to two track correction while FIG. 2d concerns the correction of three tracks.

An Encoder for Diagonal Check Bit Generation

Referring now to FIG. 3, there is shown an encoder 9 for generating the requisite parity checks required for the format of FIG. 2a. All of the vertical parity checks are implemented by a simple modulo 2 addition of the channel bit values in a vertical (cross-channel) direction. Because said vertical checks (VRC's) and their implementation are discussed at length in the prior art, see Patel U.S. Pat. No. Re. 28,923, no further discussion is believed necessary. Consequently, only the diagonal parity check generation portion of encoder 9 is shown. It consists of a shift register encoder of the type capable of generating the diagonal parity checks to be subsequently recorded by buffer/controller 3 in the cross track byte positions $B_0$, $B_8$, $B_{16}$, . . . $B_{8N}$ to satisfy the format of FIG. 2a, the vertical parity checks being recorded on channel 8 (track P). The diagonal parity check portion of encoder 9 consists of a 7 stage flip-flop shift register FF1, FF2, . . . FF6, and FF7. Interposed between each shift register stage is a multiple input, single output exclusive OR gate (XOR). Each of the XOR gates 195, 197, 199, 201, 203, and 205 in addition to coupling one register stage to another (FF3 to FF2) also has an input dedicated to a bit positioned diagonally across the channels of the set. In this regard, XOR gate 193 terminates $B_{m+i}(0)$ while XOR gate 205 receives bit from position $B_{m+i}(6)$. The bit value from position $B_{m+i}(7)$ drives stage FF7 directly.

This shift register diagonal parity encoder implements Equations (3) and (5). As shown, $\phi$ is an all-zero byte.

Check bytes $B_0$, $B_8$, $B_{16}$ etc. are generated in a continuous shift and enter process, bit by bit at the output of the shift register 6 as the $\phi$ byte and the data byte are entered in the order shown. Check byte $B_0$ is generated first, $B_8$ next, and so forth. This means that in order to generate $B_m$ where m is 0, 8, 16, 24, etc., it is necessary to shift and enter $\phi$, $B_{m+1}$, $B_{m+2}$, . . . $B_{m+7}$ bytes in that order into the shift register. When $B_{m-i}$ is entered, the $i^{th}$ bit of $B_m$ is generated at the output 6 of the register 9. So far, the encoding using the combination of a vertical parity check and a diagonal parity check can be adapted for correcting up to 2 channels in error. Although only the generation of a positively sloped diagonal parity check is described reference may be made to the co-pending Patel application U.S. Ser. No. 863,653 for a discussion relating to the generation of negatively sloped diagonal parity checks.

Recording Format and Checking For Three Channel Correction

Referring now to FIG. 2d, there is shown a format in which up to 3 known channels in error out of T channels can be corrected. As will be subsequently explained, this requires only 2 (T−1) additional check bits in excess of the 3 check channels.

With respect to the format shown in FIG. 2d, let $Z_m(t)$ denote the $m^{th}$ bit along the $t^{th}$ channel. In this regard, there are T+2 tracks numbered from 0 to T+1. The bit position value m runs from 1 to M. The $0^{th}$, $T^{th}$, and $(T+1)^{st}$ channels are reversed for recording parity checks. Each check bit in the $T+1^{st}$ channel represents the modulo 2 sum of the bits with the same position number m in each of the remaining T+1 channels. This check is called the vertical parity check. The corresponding encoding equation is:

$$Z_m(T+1) = \overset{T}{\underset{t=0}{\Sigma 0}} Z_m(t) \quad (A1)$$

Each check bit in the $0^{th}$ channel provides a parity check along the diagonal with positive slope as seen in FIG. 2d. Similarly, each check bit in the $T^{th}$ channel provides a parity check along the diagonal with negative slope. The $m^{th}$ diagonal check with positive slope, called $d_m+$ check is given by the encoding equation:

$$Z_m(0) = \overset{T}{\underset{t=1}{\Sigma 0}} Z_{m-t}(t) \quad (A-2)$$

The $m^{th}$ diagonal check with negative slope, called $d_m-$ check is given by the encoding equation:

$$Z_m(T) = \overset{T}{\underset{t=1}{\Sigma 0}} Z_{m-t}(T-t) \quad (A-3)$$

Note that at the beginning of the record, computations of the diagonal check bits for positions 0 to T−1 involves data bit values from void positions (with negative position numbers). For convenience, these data-bit values will be considered to have 0 binary value. At the end of the record, in order to provide diagonal checks to all bits in each channel, the check channels 0 and T will be extended by T−1 bits. The check bits in these extended positions also involve some data bit values from void positions which will be assumed to have 0 binary value.

At this point, the reader is reminded that the organization of buffers 3 and 7, as well as the internal controls of storage unit 5, are considered part of the prior art so that the detailed relationship between encoder 9 and buffer 3 and between buffer 7 and decoder 19 may be omitted. A typical system incorporating the general functions of buffering encoding and decoding may be found in the IBM 3803 controller and the 3420 tape drive.

The Recovery of Encoded Data

The focus of interest shifts from the mechanism by which vertical and diagonal parity checks are generated, formatted, and recorded on parallel multi-channel storage media to the ultimate objects of the invention. These are namely, the detection and correction of up to 3 known channels in error in a given set. In subsequent discussion, attention will first be directed to error syndromes and then the decoding process. The discussion of the decoding process will include separate descriptions of double channel correction with channel in error pointers, and single channel in error correction without pointers with reference to the formats shown in FIGS. 2a-c. This will be followed by a discussion of 3 channel correction with pointers, and single channel correction without pointer using the format in FIG. 2d. Lastly, reference will be made to the read backward symmetry permitting error corrections in the reverse as well as forward reading directions.

Syndrome Determination for Two Channel Correction

As previously mentioned, read back bytes may be corrupted by errors. If the parity checks denoted in Equations (4) and (5) are not satisfied, the result is called the syndrome of errors. More particularly, a "non-zero" syndrome is a clear indication of the presence of an error. Let $\hat{B}_m$ be the $m^{th}$ 8 bit byte as read back from the storage medium. Also, let $\hat{B}_m(8)$ be the byte parity as read from the medium. In this regard, the $m^{th}$ vertical parity check syndrome is denoted by $Sv_m$ according to the relation $$Sv_m = \sum_{k=0}^{8} \hat{B}_m(k) \quad (6)$$

The $m^{th}$ diagonal parity check error syndrome $Sd_m$ is $$Sd_m = \sum_{k=0}^{7} \hat{B}_{m-k}(k) \quad (7)$$

The modulo 2 difference between read $\hat{B}_m(k)$ and written $B_m(k)$ is the error pattern $e_m(k)$ in the $k^{th}$ position of $m^{th}$ byte.

$$\hat{B}_m(k) = B_m(k) \oplus e_m(k) \quad (8)$$

If Equations (4) and (6) and Equations (5) and (7) are combined and substitution of $e_m(k)$ for $[\hat{B}_m(k) \oplus B_m(k)]$, then $$Sv_m = \sum_{k=0}^{8} [\hat{B}_m(k) \oplus B_m(k)] = \sum_{k=0}^{7} e_m(k) \quad (9)$$

$$Sd_m = \sum_{k=0}^{7} [\hat{B}_{m-k}(k) \oplus B_{m-k}(k)] = \sum_{k=0}^{7} e_{m-k}(k) \quad (10)$$

Errors in any one unknown or up-to-two known erroneous tracks can now be corrected by processing syndromes Sv and Sd.

Syndrome Determination for Three Channel Correction

Syndrome processing with reference to the format shown in FIG. 2d proceeds along similar lines as that described in connection with the format shown in FIG. 2a. To distinguish between the recorded, readback data, syndromes and correction signals with the 3 track correction case (FIG. 2d) the nomenclature will be distinguished throughout the remainder of this discussion. Accordingly, Let $\hat{Z}_m(t)$ denote the bit value corresponding to the recorded $Z_m(t)$. These read-back bits may be corrupted by errors. The result of the parity checks of Equations (A-1), (A-2) or (A-3) applied to the read-back data is called the syndrome of error.

The $m^{th}$ vertical parity check yields the syndrome $$Sv_m = \sum_{t=0}^{T+1} \hat{Z}_m(t) \quad (A\text{-}4)$$

The $m^{th}$ diagonal parity check with positive slope yields the syndrome $$Sd_m^+ = \sum_{t=0}^{T} \hat{Z}_{m-t}(t) \quad (A\text{-}5)$$

The $m^{th}$ diagonal parity check with negative slope yields the syndrome $$Sd_m^- = \sum_{t=0}^{T} \hat{Z}_{m-t}(T-t) \quad (A\text{-}6)$$

Combining Equations (A-1) and (A-4), Equations (A-2) and (A-5) and Equations (A-3) and (A-6), there results $$Sv_m = \sum_{t=0}^{T+1} [\hat{Z}_m(t) \oplus Z_m(t)] \quad (A\text{-}7)$$

$$Sd_m^+ = \sum_{t=0}^{T} [\hat{Z}_{m-t}(t) \oplus Z_{m-t}(t)] \quad (A\text{-}8)$$

$$Sd_m^- = \sum_{t=0}^{T} [\hat{Z}_{m-t}(T-t) \oplus Z_{m-t}(T-t)] \quad (A\text{-}9)$$

Let $e_m(t) = \hat{Z}_m(t) \oplus Z_m(t)$ (A-10)

Substituting Equations (A-10) in Equations (A-7), (A-8) and (A-9), there results $$Sv_m = \sum_{t=0}^{T+1} e_m(t) \quad (A\text{-}11)$$

$$Sd_m^+ = \sum_{t=0}^{T} e_{m-t}(t) \quad (A\text{-}12)$$

$$Sd_m^- = \sum_{t=0}^{T} 0 \, e_{m-t}(T-t) \quad \text{(A-13)}$$

Many different types of errors can be corrected by processing these syndromes. In magnetic tapes, the predominant errors are channel errors caused by large sized defects in the magnetic medium. The erroneous channel may be identified by detecting loss of signal, excessive phase error, inadmissible recording pattern, or other similar external pointers. In the absence of such external pointers, the erroneous channel can still be identified by processing the syndromes. In the subsequent discussion there will be shown that up to three known erroneous channels can be corrected by processing of the above syndromes, and in the absence of an external pointer one erroneous channel can still be identified and corrected. In presence of a pointer for one erroneous channel, a second erroneous channel can be identified and both erroneous channels can be corrected.

Decoding Process and Means

The decoding process includes the accessing of data and the transferring of the data from the parallel multichannels of storage unit 5 to the buffer/controller 7. Here, buffer/controller 7 coacting with decoder 19 ascertains whether, in fact, any of the channels are erroneous and generates correction signals. In discussing multiple channel correction, one is reminded of the trade-off between using redundancy to establish the fact that the bits in a given channel are in error and/or using the redundancy to correct the error. In this sense, correction of error is the calculation of a data value to replace a corresponding value in error.

Two Channel Correction With Pointers

If errors can be confined to at most two known channels as indicated by channel error pointers i and j, where $i < j$ then all errors can be corrected. In this regard, equation (9) can be rewritten in terms of errors in the $m^{th}$ byte as $$Sv_m = e_m(i) \oplus e_m(j) \quad (11)$$

Relatedly, each diagonal parity check is also affected by, at most, two error patterns. If it is assumed that all errors are corrected up to the $(m-1)^{st}$ bit position in each channel and assumed that the syndrome equations are adjusted for all corrected error patterns, then it can be shown that the errors in the $m^{th}$ byte affects the $(m+i)^{th}$ and $(M+j)^{th}$ (if $j \neq 8$) diagonal checks for which equation (10) can be rewritten as $$Sd_{m+i} = e_m(i) \quad (12)$$

$$Sd_{m+j} = e_m(j) \oplus e_{m+j-i}(i) \text{ if } j \neq 8 \quad (13)$$

Equations (11) and (12) yield the error patterns:

$$e_m(i) = Sd_{m+i} \quad (14)$$

$$e_m(j) = Sd_{m+i} \oplus Sv_m \quad (15)$$

The byte $B_m$ is then corrected using equations (8), (14), and (15) as found in:

$$B_m(i) = \hat{B}_m(i) \oplus e_m(i) \quad (16)$$

$$B_m(j) = \hat{B}_m(j) \oplus e_m(j) \quad (17)$$

If $j \neq 8$, then the $(m+j)^{th}$ diagonal syndrome is modified to reflect the correction of $B_m(j)$ as follows:

$$Sd_{m+j} \leftarrow Sd_{m+j} \oplus e_m(j) \text{ if } j \neq 8 \quad (18)$$

The above correction procedure is then applied to the next byte where m is incremented by $+1$ in the same manner. Note, the channel error pointer indices i and j can be changed at any byte position m provided that the new values of i and j are not less than the previous values of i and j respectively. Any values can be assigned to i and j, i being less than j, if all channels are error free for at least 7 consecutive bytes prior to the pointer value assignment.

Generation of an Internal Channel-in-Error Pointer and Single Channel Error Correction In this case, the $j^{th}$ channel is in error, and j is not known. An error in the $m^{th}$ byte afects the $m^{th}$ vertical parity check and $(m+j)^{th}$ diagonal parity check for which equations (9) and (10) can be rewritten as $$i \, Sv_m = e_m(j) \quad (19)$$

$$Sd_{m+j} = e_m(j), \text{ if } j \neq 8 \quad (20)$$

Note that $Sv_m = 1$ indicates the presence of an error. Index (pointer) j is the smallest integer 0 to 7 such that:

$$Sv_m = 1 = Sd_{m+j} \quad (21)$$

If $Sv_m = 1$ and $Sd_{m+j}$ is 0 for all j from 0 to 7 then $j = 8$. The byte $B_m$ is, then, corrected as $$B_m(j) = \hat{B}_m(j) \oplus e_m(j) \quad (22)$$

If $j \neq 8$, then $(m+j)^{th}$ diagonal syndrome (which will be used later) is modified to reflect the correction of $\hat{B}_m(j)$:

$$Sd_{m+j} \leftarrow Sd_{m+j} \oplus e_m(j) \quad (23)$$

Note that if index j turns out to be changed from one byte to another, then errors are not confined to one track. Such errors are not correctable without risking miscorrection. A new value for j can be used following at least seven consecutive error-free positions.

The Decoder Embodiment

Referring now to FIG. 4, there is shown a detailed logic diagram of decoder 19. It comprises a syndrome generator 23 and a syndrome processor, modifier, and error pattern generator 25, and an error corrector 27. Data $\hat{B}_{m+i}(0), \hat{B}_{m+i}(1), \ldots, \hat{B}_{m+i}(6), \hat{B}_{m+i}(7)$ is applied serially by byte and parallel by bit to diagonal syndrome generator 23. Syndrome generator 23 is formed from a seven stage shift register (stages FF1-FF7) in which the input into all stages but is the modulo 2 addition of the shift register stage content and the applied data bits.

At the same time that a data byte $\hat{B}_{m+8}$ is applied to syndrome generator 23, the data byte $B_m$ is applied to error corrector 27 also over path 21. The details of error corrector 27 shown in FIG. 5 envisage the logical combining (modulo 2 addition) of the error correction output $e_m(i)$ and/or $e_m(j)$ over respective paths 29 and 35 with counterpart elements of the data bytes to effectuate data correction which is presented to all over path 3.

Element 25 includes a syndrome processor 24 and gating arrangements 22 and 26 for modifying the syndrome contained in processor 24 and generating therefrom error correction signals $e_m(i)$ and/or $e_m(j)$. In this embodiment, up to two channels in error may be corrected.

Syndrome processor 24 consists of an eight stage shift register (FF7 ... FF0) in which the input into all stages but the first is also the modulo 2 addition of the shift register stage content and the syndrome modification deriving from gating arrangement 22. This gating arrangement applies an error correction $e_m(j)$ over path 601 to counterpart shift register 24 XOR gates as distributed by the appropriately activated pointer elements $J_1$ to $J_7$. Similarly, the shift register contents FF7 FF0 of processor 24 are distributed through gating arrangement 26 as controlled by the other channel in error pointer $I_0$ to $I_7$.

All displaced values from 0 through 7 of the diagonal syndrome $Sd_{m+i}$ are made readily available by means of a shift register logic stages $FF_7$ $FF_0$ and the associated gates of gating arrangement 26. The XOR gate coupling the stages of the shift register in processor 24 modify the stored syndrome values by means of the corrected error pattern from the previous cycle as the syndrome values are displaced into their new positions. During each cycle for every byte inserted into register 23, one bit is shifted out therefrom and enters the first stage in register 24. As shown in gating arrangement 26, AND gate 605 will pass the value $Sd_{m+i}$ as the correction signal only if two channels in error are being corrected. This is done by activating gate 605. This, in turn, is exclusively ored with the syndrome derived from the vertical parity on input 63 and applied to path 601. It is evident that if only a single channel is being corrected, then modification via path 601 and gating arrangement 22 need not be invoked to modify the syndrome contained in processor 24. In this regard, single channel correction involves only correction signal $e_m(i)$ over path 29 to error corrector 27.

I and J respectively represent pointers identifying at most two channels in error. These pointers are either externally derived or would be internally generated. The generation of pointers internally will be subsequently described.

TABLE 1

| CHANNEL ERROR POINTER LOGIC | | |
|---|---|---|
| $i^{th}$ Channel | $i < j$ | $j^{th}$ Channel |
| $I_0 = P_0$ | | $J_3 = P_8$ |
| $I_1 = \overline{P_0} P_1$ | | $J_7 = \overline{P_8} P_7$ |
| $I_2 = \overline{P_0} \overline{P_1} P_2$ | | $J_6 = \overline{P_8} \overline{P_7} P_6$ |
| $I_3 = \overline{P_0} \overline{P_1} \overline{P_2} P_3$ | | $J_5 = \overline{P_8} \overline{P_7} \overline{P_6} P_5$ |
| $I_4 = \overline{P_0} \overline{P_1} \overline{P_2} \overline{P_3} P_4$ | | $J_4 = \overline{I_4} P_4$ |
| $I_5 = \overline{I_5} P_5$ | | $J_3 = \overline{I_3} P_3$ |
| $I_6 = \overline{I_6} P_6$ | | $J_2 = \overline{I_3} P_2$ |
| $I_7 = \overline{I_7} P_7$ | | $J_1 = \overline{I_1} P_1$ |

Referring now to the Table 1 there is shown the relationship between pointers I and J to the Boolean variables $P_0, P_1, P_2, \ldots, P_8$, wherein:

$P_k = 1$ means $k^{th}$ channel in error
$P_k = 0$ means $k^{th}$ channel not in error $$0 \leq k \leq 8$$

It should be appreciated that both syndrome generation and error correction are continuous processes. $B_0, B_1, \ldots, B_m, B_{m+1}$ are shift entered into syndrome generator 23. $e_0(i)$ and $e_0(j)$ appear when $B_8$ is entered. In general, $e_m(i)$ and $e_m(j)$ are applied to the error corrector 27 when $B_{m+8}$ is entered into the syndrome generator 23.

The Generation of First Channel Error Pointer by Logic Means

The determination of the index j of the first channel in error can be made by finding the lowest values of m and j for which Equation (21) holds. This can be done by logic means or counter means. In Table 2, the relationship between the vertical and diagonal syndromes is set forth in conventional Boolean relation which identifies the smallest value j such that $$Sv_m = 1 \text{ and } Sd_{m+j} = 1$$

The method using counter means is described later in relation to the more general case with T+1 tracks.

TABLE 2

| ERROR POINTER AND SYNDROME RELATIONS |
|---|
| $J_0 = Sv_m \, Sd_m$ |
| $J_1 = Sv_m \, \overline{Sd_m} \, Sd_{m+1}$ |
| $J_2 = Sv_m \, \overline{Sd_m} \, \overline{SD_{m+1}} \, Sd_{m+2}$ |
| $J_3 = Sv_m \, \overline{Sd_m} \, \overline{Sd_{m+1}} \, \overline{Sd_{m+2}} \, Sd_{m+3}$ |
| $J_4 = Sv_m \, \overline{Sd_m} \, \overline{Sd_{m+1}} \, \overline{Sd_{m+2}} \, \overline{Sd_{m+3}} \, Sd_{m+4}$ |
| $J_5 = Sv_m \, \overline{Sd_m} \, \overline{Sd_{m+1}} \, \overline{Sd_{m+2}} \, \overline{Sd_{m+3}} \, \overline{Sd_{m+4}} \, Sd_{m+5}$ |
| $J_6 = Sv_m \, \overline{Sd_m} \, \overline{Sd_{m+1}} \, \overline{Sd_{m+2}} \, \overline{Sd_{m+3}} \, \overline{Sd_{m+4}} \, \overline{Sd_{m+5}} \, Sd_{m+6}$ |
| $J_7 = Sv_m \, \overline{Sd_m} \, \overline{Sd_{m+1}} \, \overline{Sd_{m+2}} \, \overline{Sd_{m+3}} \, \overline{Sd_{m+4}} \, \overline{Sd_{m+5}} \, \overline{Sd_{m+6}} \, Sd_{m+7}$ |
| $J_8 = Sv_m \, \overline{Sd_m} \, \overline{Sd_{m+1}} \, \overline{Sd_{m+2}} \, \overline{Sd_{m+3}} \, \overline{Sd_{m+4}} \, \overline{Sd_{m+5}} \, \overline{Sd_{m+6}} \, \overline{Sd_{m+7}}$ |

As used in Table 2 and elsewhere, $Sv_m$ is the $m^{th}$ vertical parity check syndrome while $Sd_m$ is the $(m+i)^{th}$ diagonal parity check syndrome.

Three Channel Correction With Channel Error Pointers

For decoding purposes, it has been assumed that errors are confined to at most three known erroneous channels, indicated by channel error pointers i, j and k where i is the lowest and k is the highest channel index among the erroneous channels from channel numbers 0 through T. Channel j is the remaining erroneous channel so that either $i < j < k$ or $j = T+1$.

If it is assumed that all errors are corrected up to $(m-1)^{st}$ bit position in each channel and that the syndrome equations are adjusted for all corrected patterns, then it can be shown that the error pattern in the $m^{th}$ position of erroneous channels can be determined from the syndromes $Sd_{m+i}^+$, $Sd_{m+T-k}^-$, and $Sv_m$. The equations for these syndromes can be derived from equations (A11), (A12), and (A13). Thus, upon eliminating the known zero error patterns corresponding to the error-free channels and the corrected error patterns up to $(m-1)^{st}$ positions, the syndrome equations can be written as:

$$Sd_{m+i}^+ = e_m(i) \quad (A14)$$

$$Sd_{m+T-k}^- = e_m(k) \quad (A15)$$

$$Sv_m = e_m(i) \oplus e_m(j) \oplus e_m(k) \quad (A16)$$

Equations (A14), (A15) and (A16) yield the error patterns:

$$e_m(i) = Sd_{m+i}^+ \quad (A17)$$

$$e_m(k) = Sd_{m+T-k}^- \quad (A18)$$

$$e_m(j) = Sv_m \oplus Sd_{m+i}^+ \oplus Sd_{m+T-k}^- \quad (A19)$$

The errors in $m^{th}$ positions can be corrected as follows:

$$Z_m(i) = \hat{Z}_m(i) \oplus e_m(i) \quad (A20)$$

$$Z_m(j) = \hat{Z}_m(j) \oplus e_m(j) \quad (A21)$$

$$Z_m(k) = \hat{Z}_m(k) \oplus e_m(k) \quad (A22)$$

If only two channels are in error, then any one of the error-free channels may be assigned a channel-error-pointer for processing according to the above algorithm. The resulting error pattern for this error-free channel must turn out to be zero. This furnishes an additional check against mis-corrections.

Before proceeding for the correction of the next position, the syndromes affected by these corrections must be modified (in particular those which will be used later). The modification is shown by an arrow from the previously calculated value of a syndrome (with its modification) to its new value:

$$Sd^-_{m+T-i} \leftarrow Sd^-_{m+T-i} \oplus e_m(i) \quad (A23)$$

$$Sd^+_{m+k} \leftarrow Sd^+_{m+k} \oplus e_m(k) \quad (A24)$$

$$Sd^+_{m+j} \leftarrow Sd^+_{m+j} \oplus e_m(j) \text{ if } j < T+1 \quad (A25)$$

$$Sd^-_{m+T-j} \leftarrow Sd^-_{m+T-j} \oplus e_m(j) \text{ if } j < T+1 \quad (A26)$$

Now the above correction procedure can be applied to the next bit position by incrementing the value of m by 1.

Occurrence and Use of Pointers

Up to the present point, reference has occasionally been made to the use of pointers for designating a channel or track in error. In much of the subsequent discussion reference will continue to be made to pointers, emphasizing internal generation and use. Pointers may be externally derived or internally generated. In this regard, external pointer generation usually requires some form of analog sensing of the playback conditions of data recorded on any of the several channels. The manner and means of external pointer generation is beyond the scope of this invention. Suffice to say that in the absence of external pointers, this invention also includes means for generating one or more internal pointers for error correction purposes, as well as in the presence of external pointers. A pertinent prior art example in a multichannel environment is Hinz, U.S. Pat. No. 3,639,900, "Enhanced Error Detection and Correction For Data Systems", issued Feb. 1, 1972. From column 3, line 61, through column 7, line 59 of this reference, Hinz describes the derivation of external pointers obtained from the playback of marginal performing recording channels. Other references to external pointer generation may be found in U.S. Pat. Nos. 3,508,194; 3,508,195; and 3,508,196.

Suppose a record is written on a tape with the object to play it back error free. When the tape is started and the record is at m=0, one can assume that there are no errors and all the pointers are off. If, after a period of time, an error counts on one of the channels and further, no external pointer was raised to indicate the channel error, it is necessary to generate a first internal error pointer so as to identify the channel.

Once the first internal pointer is generated, it would have to be kept on for the correction of errors in the indicated channel for the duration of the playback operation. Of course, such an assignment of a pointer might unduly limit the correction capacity of the system. This is especially true if there is no continuous error in the indicated channel. Consequently, some systems provide that a pointer can be extinguished if no error occurs within a predetermined interval after initial error detection.

In this hypothetical example one assumes the occurrence of an error in a channel. The channel identity will be generated by either an external or internal first pointer. It follows that the detection of a first channel in error is well within the correction capability of the system. It is further the case that the first pointer will be kept on for the correction of errors in the indicated channel. But what happens if another error occurs in another channel? This can likewise be indicated by a second pointer. However, the pointer to any third channel in error can only be externally generated.

To restate the situation, the first internal pointer gates on in the absence of any other pointers. Relatedly, a second internal pointer may be internally activated only when there exists a first pointer. The second internal pointer is activated irrespective of whether the first pointer is internally or externally generated.

While internal pointers are believed to be most reliable, at the most two of the three pointers available in the system of the preferred embodiment may be generated internally. Also, two simultaneous internal pointers cannot be generated. This is because the second internal pointer requires the existence of a first known pointer as a condition precedent. In this respect, the generation of internal pointers takes advantage of the diagonal parity checks and the vertical parity checks covering the channel.

The Generation of First and Second Channel Error Pointers

In the absence of track-error-pointer, we assume that errors are confined to only one track. This erroneous track can be identified and the errors can be corrected.

A non-zero pattern in the $m^{th}$ position of one track will be indicated by a non-zero vertical-parity-check syndrome $Sv_m$. Suppose this error was in the track with unknown index j and other tracks were error-free. Then from Equations (A11), (A12) we have $$Sv_m = e_m(j) = 1 \quad (A27)$$

$$Sd^+_{m+j} = e_m(j) = 1 \text{ if } j \neq T+1 \quad (A28)$$

Index j is as the smallest integer from 0 to T such that $$Sd^+{}_{m+j} = Sv_m = 1 \qquad (A29)$$

If $Sv_m=1$ and $Sd^+{}_{m+j}$ is 0 for all j from 0 to T then $j=T+1$.

Referring now to FIG. 6a, there is shown a first error pointer generator for obtaining an index of a first channel in error in the absence of any pointer. The generator comprises a pair of latches 401 and 407. These latches respectively start and stop a countdown ring counter 405. The output of ring counter 405 represents pointer j. The latches 401 and 407 are respectively responsive to syndromes $Sd^+{}_{m+T}$ and $Sv_m$. When $Sd^+{}_{m+T}=1$, then latch 401 is set and the count in counter 405 is made equal to T. For each change in the bit position m along the channel, the counter is decremented by 1. In contrast, when $Sv_m=1$, then latch 407 is set and counter 405 is stopped. The value of the counter at this juncture constitutes the pointer j. For the special case when latch 407 is set before latch 401, then, the pointer index j is equal to $T+1$.

The theory of generation of the second error pointer is developed in the co-pending application U.S. Ser. No. 863,653 filed Dec. 23, 1977 in which the equations relate to syndromes in two sets. These equations can be made applicable to the case in consideration here with small modifications. The preferred embodiment of this second error pointer generator is comprised of counter means driven by various syndromes.

Referring now to FIG. 6b, there is shown a second error pointer generator, when the first pointer is directed to a channel other than $T+1$. The generator comprises a pair of ring counters 405 and 406 respectively outputting pointer i and pointer j at ports 415 and 417. Latch 401 sets ring counter 405 of the countdown type to the value j while latch 407 sets ring counter 406 of the countup type also to value j. Stop and gate out signals are provided over a common path to both ring counters when AND gate 413 is actuated by both latches being set. Relatedly, the output 427 of AND gate 411 indicates the setting of the second pointer to the value $j=T+1$ only upon the simultaneous mismatch between the outputs of XOR gates 423 and 425. In this latter case, a mismatch of inputs $Sv_m$ and $Sd^+{}_{m+j}$ on paths 75 and 63 to XOR gate 423 sets latch 401 while a mismatch of inputs $Sv_m$ and $Sd^-{}_{m+T-j}$ on path 71 and 63 to SOR gate 425 sets latch 407.

Referring now to FIG. 6c, there is shown a second error pointer generator when the first error pointer generator is focused on channel $T+1$. The object is to obtain a second pointer i given the first pointer $j=T+1$. The generator comprises a ring counter of the countup type set to 0 by latch 427 when input $Sd^-{}_{m+T}$ is 1. The counter increments by 1 as m is incremented by 1. Initially, i is set to 0 and then i follows the value of the counter. Notably, $Sd^+{}_{m+i}$ equal to 1 will stop the counter with the count being equal to the pointer index.

While the invention has been particularly shown and described with reference to a preferred embodiment thereof, it will be understood by those skilled in the art that various changes in form and detail may be made therein without departing from the spirit and scope of the invention. In particular, the function described herein can easily be implemented with programmable logic arrays and/or softwear means without departing from the spirit and scope of the invention.

What is claimed is:

1. In combination: A parallel multi-channel data handling system, including one or more data channels, and an apparatus for correcting several channels in error simultaneously, said apparatus comprising:

means for encoding and writing into a first channel, vertical parity checks and for encoding and writing into a second channel diagonal parity checks taken over the channels, including the data channels, in a predetermined, positively or negatively sloped direction;

means for determining syndromes from the parity checks and data written into the channels;

means for detecting a mismatch among the vertical and diagonal syndromes intersecting the same error; and means responsive to the detected mismatches for generating a pointer to an unknown error channel as a function of the displacement along the channel between the first mismatch and the next subsequent mismatch among the vertical and diagonal syndromes.

2. In a parallel multi-channel data handling system according to claim 1, the means for generating said pointer includes:

a counter initialized to the lowest numbered channel in a set of consecutively numbered channels;

means for selectively incrementing or decrementing said counter; and logic means coupling the syndrome determining means for causing the incrementing means to change the counter value such that a mismatch between the far diagonal and vertical syndrome causes the counter to increment while a mismatch between the near diagonal and vertical syndromes causes the counter to decrement, said change of counter value continuing until the next mismatch between a diagonal and intersecting vertical syndrome determines when the counter is stopped.

3. An apparatus according to claim 1, wherein said apparatus further comprises means responsive to the generated pointer to the channel in error for generating correction signals from at least two syndromes intersecting the same error in the known channel; and means for correcting said errors by logically combining the correction signals with original known channel data.

4. An apparatus according to claim 1, wherein the means for encoding and writing into the second channel parity checks are limited to parity checks taken over the channel in a predetermined positively sloped direction.

5. In an apparatus for encoding and writing of data into a plurality of parallel channels, the combination comprising:

means for encoding and writing into a first channel vertical parity checks; and means for encoding diagonal parity checks, taken over all the channels in a predetermined, positively or negatively sloped direction, and writing said encoded diagonal parity checks in a format, consisting either entirely of bits written into a second channel or check bytes regularly dispersed among the data bytes in the cross channel direction.

6. In an apparatus for decoding data written into a plurality of channels, means for ascertaining channels in error externally and generating pointer signals thereto, said channel plurality being partitioned into one or more data channels, a first channel containing vertical parity checks of the data channels, and a second channel containing diagonal parity checks taken over all the channels in a predetermined positively or negatively sloped direction, wherein the improvement comprises the combination of:

means for determining syndromes from the parity checks and data written into the channels;

means for detecting mismatches between the vertical and diagonal syndromes, intersecting the same error in a known error channel, one syndrome intersecting an unknown error channel; and means responsive to an external pointer signal designating a known error channel and to a mismatch among the vertical and diagonal syndromes intersecting the same error in the known channel for generating an internal pointer to an unknown error channel as a function of the displacement between the first and subsequent vertical and diagonal syndrome mismatch.

7. In an apparatus according to claim 6, the combination further includes means responsive to the external and internally generated pointers designating no more than two known channels in error for generating correction signals from at least two syndromes intersecting the same error in the known channel; and means for correcting said errors by logically combining the correction signals with original known channel data.

8. In combination, a parallel multi-channel data handling system, including one or more data channels, and an apparatus for correcting plural channels in error simultaneously, the apparatus comprising:

means for encoding and writing into a first channel vertical parity checks and for encoding and writing into a second channel diagonal parity checks taken over the channels, including the data channels, in a predetermined, positively or negatively sloped direction;

means for determining syndromes from the parity checks and data written into the channels;

means for detecting mismatches between the vertical and diagonal syndromes intersecting the same error;

means responsive to the detected mismatches for generating pointers designating at least one known channel in error;

means responsive to pointers designating at least one known channel in error and to the detected mismatches for generating correction signals from at least two syndromes intersecting the same error in the known channel, said mens including means for continuously modifying the value of syndrome diagonally intersecting each error in the known channel as it is detected; and means for correcting said errors by logically combining the correction signals with original known channel data.

9. An apparatus according to claim 8 wherein the means for correcting errors includes means for selecting as between two diagonal syndromes, the one closest to the known channel in error.

10. An apparatus according to claim 8, wherein said parity value modification consists of inversion of the instant modulo 2 value.

11. An apparatus according to claim 8, wherein the means for continuously modifying the value of syndromes diagonally intersecting each error in the known channel as it is detected comprises means for executing the modulo 2 addition of the error value to the respective values of the diagonal intersecting syndromes.

* * * * *

UNITED STATES PATENT AND TRADEMARK OFFICE
CERTIFICATE OF CORRECTION

PATENT NO. : 4,205,324

DATED : May 27, 1980

INVENTOR(S) : Arvind M. Patel

It is certified that error appears in the above-identified patent and that said Letters Patent are hereby corrected as shown below:

Col. 7, line 52, "$Sv_m = \Sigma_{k=0}^{8} B_m(k)$" should read $--Sv_m = \Sigma_{k=0}^{8} \hat{B}_m(k)--$ Col. 7, line 57, "$Sd_m = \Sigma_{k=0}^{7} B_{m-k}(k)$" should read $--Sd_m = \Sigma_{k=0}^{7} \hat{B}_{m-k}(k)--$.

Col. 7, line 64, "$B_m(k) = B_m(k) \oplus e_m(k)$" should read $--B_m(k) = \hat{B}_m(k) \oplus e_m(k)--$.

Col. 8, line 37 "$Sd_m+ = \Sigma_{t=0}^{T} Z_{m-t}(t)$" should read $--Sd_m+ = \Sigma_{t=0}^{T} \hat{Z}_{m-t}(t)--$.

Col. 8, line 43 "$Sd_m- = \Sigma_{t=0}^{T} Z_{m-t}(T-t)$" should read $--Sd_m- = \Sigma_{t=0}^{T} \hat{Z}_{m-t}(T-t)--$.

Col. 8, line 50 "$Sv_m = \Sigma_{t=0}^{T+1} [Z_m(t) \oplus Z_m(t)]$" should read $--Sv_m = \Sigma_{t=0}^{T+1} [\hat{Z}_m(t) \oplus Z_m(t)]--$.

UNITED STATES PATENT AND TRADEMARK OFFICE
CERTIFICATE OF CORRECTION

PATENT NO. : 4,205,324
DATED : May 27, 1980
INVENTOR(S) : Arvind M. Patel

It is certified that error appears in the above-identified patent and that said Letters Patent are hereby corrected as shown below:

Col. 8, line 53 "$Sd_m+ = \sum_{t=0}^{T} 0 \ [Z_{m-t}(t) \oplus Z_{m-t}(t)]$" should read
--$Sd_m+ = \sum_{t=0}^{T} 0 \ [\hat{Z}_{m-t}(t) \oplus Z_{m-t}(t)]$--.

Col. 8, line 55 "$Sd_m- = \sum_{t-0}^{T} 0 \ [Z_{m-t}(T-t) \oplus Z_{m-t}(T-t)]$" should
read --$Sd_m- = \sum_{t=0}^{T} 0 \ [\hat{Z}_{m-t}(T-t) \oplus Z_{m-t}(T-t)]$--.

Col. 8, line 57 "Let $e_m(t) = Z_m(t) \oplus Z_m(t)$" should read
--Let $e_m(t) = \hat{Z}_m(t) \oplus Z_m(t)$--.

Col. 10, line 28 "i $Sv_m - e_m(j)$" should read --$Sv_m - e_m(j)$--.

Col. 14, line 66 "$Sd^+_{m+j} = e_m(j) = 1 \text{ if } j \neq T+1$" should read
--$Sd^+_{m+j} = e_m(j) - 1 \text{ if } j \neq T+1$--.

Col. 18, line 15 change "mens" to --means--.

Col. 18, line 16 change "syndrome" to --syndromes--.

---

Col. 7, lines 67 and 68, "$[B_m(k) \oplus B_m(k)]$" should read
--$[\hat{B}_m(k) \oplus B_m(k)]$--.

UNITED STATES PATENT AND TRADEMARK OFFICE
CERTIFICATE OF CORRECTION

Page 3 of 3

PATENT NO. : 4,205,324
DATED : May 27, 1980
INVENTOR(S) : Arvind M. Patel

It is certified that error appears in the above-identified patent and that said Letters Patent are hereby corrected as shown below:

Col. 8, line 3, "$Sv_m = \sum_{k=0}^{8} [B_m(k) \oplus B_m(k)] = \sum_{k=0}^{7} e_m(k)$"

should read --$Sv_m = \sum_{k=0}^{8} [\hat{B}_m(k) \oplus B_m(k)] = \sum_{k=0}^{7} e_m(k)$--.

Col. 8, line 6, "$Sd_m = \sum_{k=0}^{7} [B_{m-k}(k) \oplus B_{m-k}(k)] = \sum_{k=0}^{7} e_{m-k}(k)$" should read --$Sd_m = \sum_{K=0}^{7} [\hat{B}_{m-k}(k) \oplus B_{m-k}(k)] = \sum_{k=0}^{7} e_{m-k}(k)$--.

Col. 12, line 31 "$J_0 - Sv_m Sd_m$" should read --$J_0 = Sv_m Sd_m$--.

Signed and Sealed this

Ninth Day of December 1980

[SEAL]

*Attest:*

SIDNEY A. DIAMOND

*Attesting Officer*   *Commissioner of Patents and Trademarks*